United States Patent [19]

Kasuga

[11] Patent Number: 4,524,422
[45] Date of Patent: Jun. 18, 1985

[54] DIGITAL EQUALIZER CAPABLE OF VARYING THE CENTER FREQUENCY, QUALITY FACTOR, AND GAIN TO PERFORM VARIOUS FREQUENCY CHARACTERISTICS

[75] Inventor: Masao Kasuga, Sagamihara, Japan

[73] Assignee: Victor Company of Japan, Limited, Yokohama, Japan

[21] Appl. No.: 187,328

[22] Filed: Sep. 15, 1980

[30] Foreign Application Priority Data

Sep. 14, 1979 [JP] Japan .................................. 54-118627
Sep. 14, 1979 [JP] Japan .................................. 54-118628

[51] Int. Cl.³ .............................................. G06F 15/31
[52] U.S. Cl. .................................................... 364/724
[58] Field of Search .......................................... 364/724

[56] References Cited

U.S. PATENT DOCUMENTS 3,619,586 11/1971 Hoff, Jr. ............................. 364/724
4,305,133 12/1981 Amada et al. ..................... 364/724

OTHER PUBLICATIONS

Rader et al., "Digital Filter Design Techniques in the Frequency Domain", *Proceedings of the IEEE*, vol. 55, No. 2, Feb. 1967, pp. 149–171.
Nishimura et al., "Realizations of Digital Filters Using Generalized Multiple-Feedback Structure", Memoirs of the Faculty of Engineering, Kobe University, No. 24, Mar. 1978, pp. 127–139.

Primary Examiner—David H. Malzahn
Attorney, Agent, or Firm—Posnack, Roberts, Cohen & Spiecens

[57] ABSTRACT

A digital filter having a band-pass filter characteristic or a band-elimination characteristic is constructed by a designing procedure comprising a step in which a function H(z) is obtained from a Z-transform of a bi-quad transfer function H(s) in a Laplace transfer form comprising conjugate pairs of poles and zeros, and establishing a center frequency of the filter characteristic from the radius of a circle in the s-plane in which the poles and zeros of the bi-quad transfer function H(s) are on the same circle, a step in which a quality factor Q of the filter characteristic is established so as to satisfy the following two equations (I) and (II) in which $\sigma_1$ is the real-axis projection part and $\omega_1$ is the imaginary-axis projection part of the above two poles in the s-plane, and $\sigma_2$ is the real-axis projection part and $\omega_2$ is the imaginary-axis projection part of the above two zeros, and a step in which a gain at the center frequency of the filter characteristic is established from a ratio $\sigma_2/\sigma_1$ of the real-axis projection part $\sigma_1$ of the poles and the real-axis projection part $\sigma_2$ of the zeros in the s-plane $$\sigma_i = \frac{\omega_i}{2Q_i} \qquad (I)$$

$$\omega_i = \sqrt{\left(\frac{\omega_i}{2Q_i}\right)^2 - \omega_i^2} \quad (i = 1 \text{ or } 2). \qquad (II)$$

1 Claim, 18 Drawing Figures

EQUALIZER CAPABLE OF VARYING THE CENTER FREQUENCY, QUALITY FACTOR, AND GAIN TO PERFORM VARIOUS FREQUENCY CHARACTERISTICS

BACKGROUND OF THE INVENTION

This invention relates generally to digital equalizers, and more particularly to a digital equalizers designed so that a desired band-pass filter characteristic or band-elimination filter characteristic can be obtained by variably establishing the quality factor (Q), a center frequency, and gain.

Heretofore, a known method of designing and constructing a digital filter is by obtaining a function H(z) from the Z-transform of the transfer function H(s) which comprises a plurality of poles and zeros of the Laplace transformation form. This, for example, is seen in "IEEE Transactions on Audio and Electroacoustics", Vol. Au-16, No.3, Sep., 1968, Pages 350–391. But in the previous attempts to design a band-pass or band-elemination filter, an arbitary point was determined on the imaginary axis of the s-plane (complex-plane), the center frequency was determined by the distance from that point to the origin, poles were determined on a semi-circle on the left-hand side plane having that point as its center, and the cut-off frequency of the filter was determined by the radius of that semi-circle. Furthermore, the designing was done by positioning the zeros at the origin or infinity. Therefore, by this known method, not all types of filters can be designed, and was disadvantageous in that this designing method lacked general applicability. In addition, it was disadvantageous in that designing of the filter by arbitrarily varying the quality factor Q, the gain, the center frequency and the like, was difficult.

SUMMARY OF THE INVENTION

Accordingly, a general object of the present invention is to provide a novel and useful digital equalizer in which the above described problems have been overcome.

Another and more specific object of the present invention is to provide a digital equalizer in which the poles and zeros of the bi-quad transform function H(s) in the Laplace transformation form are positioned on the same circle and the radius of that same circle is prescribed as the center angular frequency of the filter characteristic, determine the quality factor Q of the filter characteristic so as to satisfy the equations $$\sigma_i = \frac{\omega_i}{2Q_i}, \text{ and } \omega_i = \sqrt{\left(\frac{\omega_i}{2Q_i}\right)^2 - \omega_i} \ (i = 1 \text{ or } 2),$$

where the real-axis projection part of the above two poles in the s-plane is $\sigma_1$, the imaginary-axis projection part is $\omega_1$, the real-axis projection part of the two zeros is $\sigma_2$, and the imaginary-axis projection part is $\omega_2$, determine the gain at the center frequency of the filter characteristic from the ratio $\sigma_2/\sigma_1$ of the real-axis projection part $\sigma_1$ of the poles and real-axis projection part $\sigma_2$ of the zeros in the s-plane, to have band-passs or band-elimination equalizer characteristics. In the digital filter of the present invention, in either the band-pass or band-elimination filter characteristics, the filter can be designed by determining the quality factor Q, center frequency and gain, a known analog filter theory can be applied to the digital filter, and the quality factor Q can easily be determined since the quality factor Q was set up to be determined by $\omega_i/2\sigma_i$ (i=1 or 2).

Still another object of the invention is to provide a variable digital equalizer in which the poles and zeros of the bi-guard transform function H(s) in the Laplace transformation form are positioned on the same circle and the radius of that same circle is prescribed as the center frequency of the filter characteristic, determine the quality factor Q of the filter characteristic from the ratio between either the real-axis projection part $\sigma_1$ and imaginary-axis projection part $\omega_1$ of the above two poles, or the real-axis projection part $\sigma_2$ and imaginary-axis projection part $\omega_2$ of the above two zeros, determine the gain at the center frequency of the filter characteristic from the ratio $\sigma_2/\sigma_2$ of the real-axis projection part $\sigma_1$ of the poles and real-axis projection part $\sigma_2$ of the zeros in the s-plane, to have band-pass or band-elimination filter characteristics, and for the values of both the poles and zeros of the above bi-quad transfer function H(s) to be varied maintaining the relationship of being on the same circle on the s-plane. In the digital equalizer according to the present invention, the center frequency of the above band-pass or band-elimination filter characteristics can be varied by varying the radius of the circle in the above s-plane, the quality factor Q can be varied by varying either the ratios between $\sigma_1$ and $\omega_1$ or $\sigma_2$ and $\omega_2$, and the gain can also be varied by varying the ratio $\sigma_2/\sigma_1$. Compared to the known variable digital filter in which the center frequency is determined from the distance between an arbitrary point on the imaginary-axis and the origin in the s-plane, and the cut-off frequency is determined from the radius of the semi-circle comprising poles, according to the present invention, the designing of the filter is facilitated since the quality factor Q and the gain are respectively determined from angles between the origin and poles, and origin and zeros. Furthermore, the two parameters of the quality factor Q and the gain can easily be successively varied by a predetermined function, and the quality factor Q, the gain, and the center frequency can all be related by a simple function, and thus from this relationship, the coefficients of the digital filter can easily be varied, allowing the construction of a predetermined variable digital filter.

Other objects and further features of the present invention will be apparent from the following detailed description when read in conjunction with the accompanying drawings.

DETAILED DESCRIPTION

Generally, upon designing of a filter, a parallel resonant circuit filter comprising a coil L, a capacitor C, and a resistor R is considered. If we assume the input voltage supplied to the parallel resonant circuit to be $V_0$, the current within the circuit as $I_0$, and the impedance as $Z$, there is the following relationship between them:

$$Z = \frac{V_0}{I_0} = \frac{1}{j\omega C + \frac{1}{R} + \frac{1}{j\omega L}} \quad (1)$$

By rewriting the above equation (1) with the use of Laplace operator s, the following equation (1) is obtained.

$$Z(s) = \frac{\frac{1}{C} s}{s^2 + \frac{1}{CR} s + \frac{1}{CL}} \quad (2)$$

By rearranging the equation (2), the following equation is obtained.

$$Z(s) = \frac{\frac{1}{C} s}{(s - s_a)(s - s_b)} \quad (3)$$

The terms $s_a$ and $s_b$ in the denominator of the equation (3) can be described by the following equation from the denominator of the equation (2):

$$s_i = -\frac{1}{2CR} \pm \sqrt{\left(\frac{1}{2CR}\right)^2 - \frac{1}{LC}} \quad (i = a, b) \quad (4)$$

On the other hand, in the above parallel LCR resonant circuit, the center frequency $\omega_0$ and the quality factor Q are respectively known to be expressible by the following equation.

$$\left.\begin{array}{l} \omega_0 = \frac{1}{\sqrt{LC}} \\ Q = \omega_0 CR \end{array}\right\} \quad (5)$$

By using the equation (5) to express the equation (4), it becomes of a form shown in the equation (6).

$$s_i = -\frac{\omega_0}{2Q} \pm \sqrt{\left(\frac{\omega_0}{2Q}\right)^2 - \omega_0^2} \quad (i = a, b) \quad (6)$$

Here, when the quality factor Q is greater than 10, the error produced is less than 0.2%, and hence by approximation, $$s_i \approx -\frac{\omega_0}{2Q} \pm j\omega_0 \quad (i = a, b) \quad (7)$$

Therefore, the following general equation can be obtained:

$$Z(s) = k \frac{s^2 + \frac{\omega_{02}}{Q_2} \cdot s + \omega_{02}^2}{s^2 + \frac{\omega_{01}}{Q_1} \cdot s + \omega_{01}^2} \quad (8)$$

Here, k is a coefficient to normalize $Z(s)$. And, since the roots of the denominator and the numerator are usually conjugate functions, the roots of the denominator will be expressed by $s_1$ and $\bar{s}_1$, and the roots of the numerator will be expressed by $s_2$ and $\bar{s}_2$.

The designing of an embodiment of a digital filter of the present invention will now be described. There has been a plurality of proposals for designing techniques in which the digital filter is allowed a predetermined frequency characteristic upon designing of the digital filter, but according to the present invention, the difference equation of the digital filter is obtained by using a technique called matched X-transform which transforms from the s-domain (Laplace transform system) to the z-domain.

Figure 1:
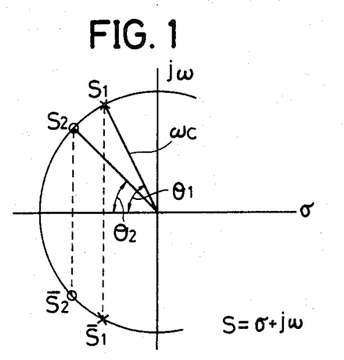
FIG. 1 is a graph showing a state in which the poles and zeros are positioned on the same circle in the s-plane.

First, the equation (8) comprises zeros $s_2$ and $\bar{s}_2$, and poles $s_1$ and $\bar{s}_1$, and these are positioned on the same circle of radius $\omega_c$ in the s-plane as shown in FIG. 1. If the angle between the real-axis and the pole $s_1$ in the s-plane is designated by $\theta_1$, and the angle between the real-axis and the zero $s_2$ by $\theta_2$, the following equations can be formed.

$$\left.\begin{array}{l} s_1 = -\omega_c\cos\theta_1 + j\omega_c\sin\theta_1 \\ \bar{s}_1 = -\omega_c\cos\theta_1 - j\omega_c\sin\theta_1 \end{array}\right\} \quad (9)$$

$$\left.\begin{array}{l} s_2 = -\omega_c\cos\theta_2 + j\omega_c\sin\theta_2 \\ \bar{s}_2 = -\omega_c\cos\theta_2 - j\omega_c\sin\theta_2 \end{array}\right\} \quad (10)$$

By using the roots $s_1$ and $\bar{s}_1$ of the denominator in the equation (8), a band-pass filter is designed, and by using the roots $s_2$ and $\bar{s}_2$ of the numerator in the equation (8), a band-elimination filter is designed. $\bar{s}_1$ and $\bar{s}_2$ are, respectively, conjugate complex numbers of $s_1$ and $s_2$. Hence, from the equation (7), (8), and (9), in the case of a band-pass filter, $$\left. \begin{array}{l} s_1 = -\dfrac{\omega_0}{2Q_1} + j\omega_0 = -\omega_c\cos\theta_1 + j\omega_c\sin\theta_1 \\ \bar{s}_1 = -\dfrac{\omega_0}{2Q} + j\omega_0 = -\omega_c\cos\theta_1 + j\omega_c\sin\theta_1 \end{array} \right\}$$

and the following set of equations can be obtained:

$$\left. \begin{array}{l} \omega_0 = \omega_c\sin\theta_1 \\ Q_1 \approx \dfrac{\sin\theta_1}{2\cos\theta_1} \end{array} \right\} \quad (11)$$

Similarly, for a band-elimination filter, $$\left. \begin{array}{l} \omega_0' = \omega_c\sin\theta_2 \\ Q_2 \approx \dfrac{\sin\theta_2}{2\cos\theta_2} \end{array} \right\} \quad (12)$$

Thus it can be seen that the quality factor Q of the circuit can be established from the angle between $s=0+j0$ and the pole or zero.

The following set of equations can be formed, in which $\sigma_1$ is the real-axis projection part of the pole in the s-plane, $\omega_1$ is the imaginary-axis projection part of the pole in the s-plane, $\sigma_2$ is the real-axis projection part of the zero in the s-plane, and $\omega_2$ is the imaginary-axis projection part of the zero in the s-plane.

$$\left. \begin{array}{l} s_1 = -\sigma_1 + j\omega_1 \\ \bar{s}_1 = -\sigma_1 - j\omega_1 \\ s_2 = -\sigma_2 + j\omega_2 \\ \bar{s}_2 = -\sigma_2 - j\omega_2 \end{array} \right\} \quad (13)$$

And, from the equation (8), the following bi-quad transfer function H(s) can be formed (for k=1).

$$H(s) = \frac{(s-s_2)(s_2-\bar{s}_2)}{(s-s_1)(s-\bar{s}_1)} \quad (14)$$

By transforming this equation (14) with the use of the matched Z-transform, the following equation is obtained.

$$H(z) = \frac{(z-z_2)(z-\bar{z}_2)}{(z-z_1)(z-\bar{z}_1)} = \frac{Y(z)}{X(z)} \quad (15)$$

where $$\left. \begin{array}{l} z_1 = e^{-\sigma_1 T}e^{j\omega_1 T} \\ \bar{z}_1 = e^{-\sigma_1 T}e^{-j\omega_1 T} \\ z_2 = e^{-\sigma_2 T}e^{j\omega_2 T} \\ \bar{z}_2 = e^{-\sigma_2 T}e^{-j\omega_2 T} \end{array} \right\} \quad (16)$$

in which T is a sampling period, and $$\omega_c = \sqrt{\sigma_1^2 + \omega_1^2}, \quad \omega_c = \sqrt{\sigma_2^2 + \omega_2^2}.$$

When a digital filter is designed using the equations (15) and (16), a band-pass filter characteristic comprising a center frequency determined by $\omega_c$ and the quality factor Q determined by the equation (11), and a band-elimination filter characteristic comprising a center frequency determined by $\omega_c$ and the quality factor Q determined by the equation (12) is obtained. In these filters, the information of the s-domain is preserved, and confirmed by experimentation that the equations (11) and (12) both stand in the Z-domain.

Accordingly, a digital filter having the equation (15) as a precondition, and having either band-pass filter characteristic or band-elimination filter characteristic, can be determined by the following three conditions, from the equations (9), (10), (13) and the like.

$$\left. \begin{array}{l} Q_1 \approx \dfrac{\omega_i}{2\sigma_i} \\ \omega_c = \omega_1/\sin\theta_1 \\ \omega_c = \omega_2/\sin\theta_2 \end{array} \right\} \quad (17)$$

Figure 2:
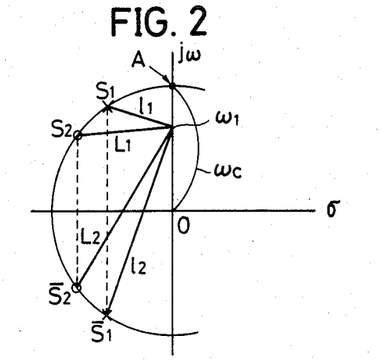
FIG. 2 is a graph showing the arrangement of the poles and zeros in the s-plane for describing the establishment of the gain of the present invention.

H(z) of the equation (15) has an amplitude characteristic which is determined by the following equation.

$$|H(z)| = \frac{L_1 L_2}{l_1 l_2} \quad (18)$$

in which the distances from a point on the imaginary-axis to the poles $s_1$ and $\bar{s}_1$ are, respectively, $l_1$ and $l_2$, and the distance to the zeros are, respectively, $L_1$ and $L_2$. If the radius is $\omega_c$, the gain of either the band-pass filter or the band-elimination filter having a center frequency of $\omega_c$ can be obtained from the distance between the intersection point (shown by point A in FIG. 2) of the circle of radius $\omega_c$ and the imaginary-axis in the s-plane, to each of the poles and zeros. Therefore, the distance between point A are expressed by the following equation (19) when the angles $\theta_1$ and $\theta_2$ are set as shown in FIG. 1.

$$\left. \begin{array}{l} l_1 = \sqrt{\omega_c^2\cos^2\theta_1 + \omega_c^2(1-\sin\theta_1)^2} \\ l_2 = \sqrt{\omega_c^2\cos^2\theta_1 + \omega_c^2(1+\sin\theta_1)^2} \\ L_1 = \sqrt{\omega_c\cos^2\theta_2 + \omega_c^2(1-\sin\theta_2)^2} \\ L_2 = \sqrt{\omega_c\cos^2\theta_2 + \omega_c^2(1+\sin\theta_2)^2} \end{array} \right. \quad (19)$$

Hence, from the equations (18) and (19), the following equation is obtained.

$$H(z) = \frac{\omega_c^2 \sqrt{2(1 - \sin\theta_2)} \cdot \sqrt{2(1 + \sin\theta_2)}}{\omega_c^2 \sqrt{2(1 - \sin\theta_1)} \cdot \sqrt{2(1 + \sin\theta_1)}} \quad (20)$$

$$= \frac{\cos\theta_2}{\cos\theta_1} = \frac{\sigma_2}{\sigma_1} = G$$

The gain can be determined from the above equation (20).

To write this in the term of dB, the following equation (21) can be used.

$$dB = 20 \log |H(z)| = 20 \log \left(\frac{\cos\theta_2}{\cos\theta_1}\right) \quad (21)$$

In addition to the condition of the equation (17), upon obtaining a band-pass filter characteristic, or a band-elemination filter characteristic, since $0<\theta_1$, and $\theta_2<\pi/2$, when $\theta_2 \geq \theta_1$, $$|H(z)|e^{j\omega_c T} \leq 1 \quad (22)$$

and when $\theta_2 < \theta_1$, $$|H(z)|e^{j\omega_c T} > 1 \quad (23)$$

It can be seen that the equation (22) describes a digital filter having a band-elimination filter characteristic, and the equation (23) describes a digital filter having a band-pass filter characteristic.

The difference equation corresponding to the equation (15) is expressed by the following equation.

$$y_n = a_0 x_n + a_1 x_{n-1} + a_2 x_{n-2} + b_1 y_{n-1} + b_2 y_{n-2} \quad (24)$$

In the equation (24), $y_n$ is the output signal series of the digital filter at time nT (n is an interger), $x_n$ is the input signal series of the digital filter a time nT, T is the sampling period of the input digital signal, and $a_0$, $a_1$, $a_2$, $b_1$, and $b_2$ are all coefficients. This can be obtained by transforming the equation (16) as the following equation.

$$H(z) = \frac{Y(z)}{X(z)} = a_0 \frac{1 - (z_2 + \bar{z}_2)z^{-1} + z_2\bar{z}_2 z^{-2}}{1 - (z_1 + \bar{z}_1)z^{-1} + z_1\bar{z}_1 z^{-2}} \quad (25)$$

Here, $a_0$ is a normalized coefficient. When $Y(z) = y_n$, and $Y(z)z^{-1} = y_{n-1}$, the following equation is obtained from the equation (25).

$$y_n - (z_1 + \bar{z}_1)y_{n-1} + z_1\bar{z}_1 y_{n-2} = \quad (26)$$

$$a_0 x_n - (z_2 + \bar{z}_2)x_{n-1} + z_2\bar{z}_2 x_{n-2}$$

If we set $\cos\theta_2 = p$, and $\cos\theta_1 = q$ in the equations (9) and (10), the following equation (27) stands from the equations (24) and (26).

$$a_1 = -(z_2 + \bar{z}_2) = -e^{-\omega_c T p} \times 2\cos(\omega_c T \sqrt{1 - p^2})$$

$$a_2 = z_2\bar{z}_2 = e^{-2\omega_c T p}$$

-continued $$b_1 = -e^{-\omega_c T q} \times 2\cos(\omega_c T \sqrt{1 - q^2})$$

$$b_2 = z_1 \bar{z}_1 = e^{-2\omega_c T q} \quad (27)$$

$$a_0 = \left|\frac{1 + a_1 + a_2}{1 + b_1 + b_2}\right|$$

Figure 3:
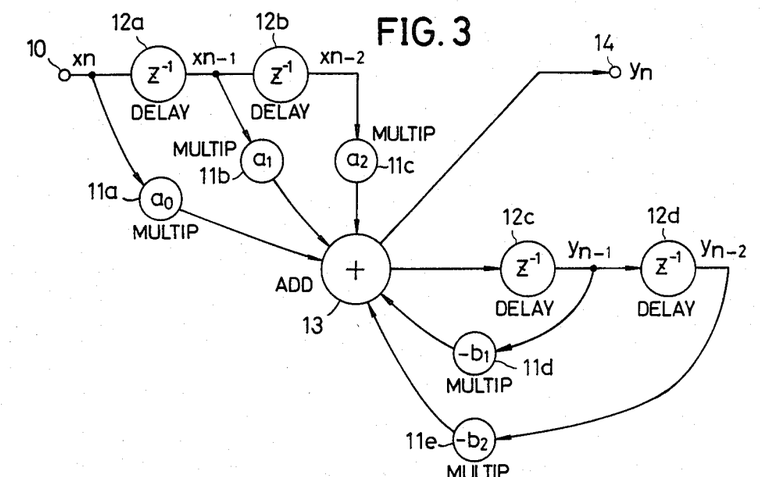
FIG. 3 is a systematic block diagram showing a general digital filter.

A digital filter having the coefficients of the equation (27), and the band-pass filter characteristic or band-elimination filter characteristic described by the difference equation (26), is a recursive digital filter as shown in the systematic block diagram of FIG. 3.

In FIG. 3, the input digital signal from an input terminal 10 is supplied respectively to a multiplier 11b which gives the coefficient $a_1$ through a delay element 12a which has a delay time of a sampling period, and a multiplier 11c which gives the coefficient $a_2$ through delay elements 12a and 12b. The signal multiplied by the coefficients upon passing through multipliers 11a through 11c are supplied to an adder 13, and the output signal of the adder 13 is obtained from an output terminal 14.

Figure 4:
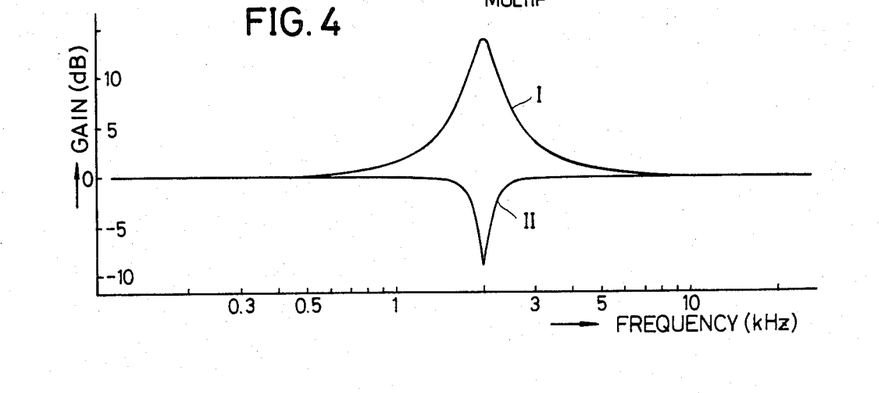
FIG. 4 is a graph showing each examples of the frequency characteristics of the digital equalizer of the present invention.

The digital signal $y_n$ picked up from the adder 13 is transformed into a digital signal $y_{n-1}$ by a delay element 12c which has a delay time of a sampling period, and further transformed into a digital signal $y_{n-2}$ by another delay element 12d which also has a delay time of a sampling period. The above digital signal $y_{n-1}$ is supplied to the adder 13 having given a coefficient $-b$, by a multiplier 11d, and on the other hand, the digital signal $y_{n-2}$ is supplied to the adder 13 having given a coefficient $-b$ by a multiplier 11e. Accordingly, a digital signal $y_n$ expressed by the difference equation (24) is applied to the output terminal 14 from the adder 13. An embodiment of the design according to the present invention will now be described. Upon designing of a digital filter having a band-pass filter characteristic with the quality factor Q of 5, a center frequency of 2 khz, and a sampling period T of 20 μs, the following equation are obtained from the equations (17) and (9), $$5 = \frac{\omega_1}{2\sigma_1} = \frac{\sin\theta_1}{2\cos\theta_1}$$

$$10 \cos\theta_1 = \sin\theta_1$$

hence $\cos\theta_1 = \pm \frac{1}{\sqrt{101}}$ and $\theta_1 = \pm 84.28944$ degrees since $0 < \theta_1 < \frac{\pi}{2}$, $\theta_1 = 84.28944$ degrees In addition, $\omega_c$ is $2\pi \cdot 2 \times 10^3$, and thus if $\theta_2 = 60°$ from the equation (23), for example, a band-pass filter characteristic can be obtained. This band-pass filter characteristic is shown by the curve I in FIG. 4. The gain at a center frequency of 2 khz is 14.02338 dB from the equation (21). From the equation (27), the coefficients of the difference equation is expressed by the following equation (28).

$a_0 = 1.1031010$ (28)

$a_1 = -1.722208$ $a_2 = 0.7777678$ $b_1 = -1.8899310$ $b_2 = 0.9512188$

To similarly construct a digital filter having a band-elimination filter characteristic with the quality factor Q of 14.3, and a center frequency of 2 kHz, $\theta_1$ and $\theta_2$ are respectively set at 84.28944 and 88 degrees. The gain at the center frequency is $-9.09952$ dB, and each of the coefficients of the difference equation of the digital filter are obtained from the equation (27), as shown in the following equation.

$a_0 = 0.9839891$ (29)

$a_1 = -1.9203250$ $a_2 = 0.9826106$ $b_1 = -1.8899310$ $b_2 = 0.95121880$

The band-elimination filter characteristic of the digital filter is shown by the curve II in FIG. 4.

Thus, by determining the quality factor Q, the center frequency $\omega_c$, and the gain of the band-pass filter characteristic or the band-elimination filter characteristic, the digital filter can be designed by calculation.

In the above embodiment, the quality factor Q was simply obtained from the equation (7), but by relating the equations (6) and (13) and solving a second-order function of $Q_i$ and $\omega_i$, the quality factor Q can be determined accurately. This is to say, to solve a equation (30) below algebraicly as a second-order function of $Q_i$ and $\omega_i$.

$$\sigma_i = \frac{\omega_1}{2Q_i} \quad (i = 1,2) \tag{30}$$

The above designing technique can also be employed in designing a digital filter comprising a plurality of poles and zeros which has a plurality of the above digital filters connected in series, and similarly applicable to a digital filter in which the above digital filters are connected in parallel to obtain a band-pass filter characteristic or a band-elimination filter characteristic comprising a certain number of peaks and dips.

Another embodiment of the present invention will now be described. Generally, upon designing of an analog filter, if the resonant quality factor of its resonant circuit is designated by the quality factor Q, and the center frequency by $\omega_0$, the transfer function is known to be describable by the Laplace transform operator s as shown in the following equation.

$$H(s) = \frac{as}{s^2 + \frac{\omega_0}{Q}s + \omega_0^2} \tag{31}$$

However, the letter a in the equation (31) designates a constant. By rewriting the above equation (31) into a general form, the following equation is obtained.

$$H(s) = k \frac{s^2 + \frac{\omega_2}{Q_2}s + \omega_2^2}{s^2 + \frac{\omega_1}{Q_1}s + \omega_1^2} \tag{32}$$

The k in the equation (32) is a coefficient to normalize H(s). The roots $s_1$ and $\bar{s}_1$ of the denominator, and the roots $s_2$ and $\bar{s}_2$ of the numerator in the equation (32) are expressed by the following equation.

$$\left. \begin{array}{l} s_i = -\frac{\omega_i}{2Q_i} + \sqrt{\left(\frac{\omega_i}{2Q_i}\right)^2 - \omega_i^2} \\ \\ \bar{s}_i = -\frac{\omega_i}{2Q_i} - \sqrt{\left(\frac{\omega_i}{2Q_i}\right)^2 - \omega_i^2} \end{array} \right\} \tag{33}$$

Here, $i = 1$ and 2. And by approximation, the equation (33) can be written as the following equation.

$$\left. \begin{array}{l} s_i \approx -\frac{\omega_i}{2Q_i} + j\omega_i \\ \\ \bar{s}_i \approx -\frac{\omega_i}{2Q_i} - j\omega_i \end{array} \right\} \tag{34}$$

While the $Q_i$ represented by the above equation (17) and the gain G represented by the equation (20) can be determined by each design, in actual practice, complicated calculations must be carried out in order to continuously vary (change) these quantities. Therefore, when a variable digital filter is to be designed, a method in which these quantities are easily established and varied, becomes necessary. Accordingly, this method will now be described. The above equation (17) can be rewritten as follows:

$$Q_1 = \frac{\omega_1}{2\sigma_1} = \frac{\sin\theta_1}{2\cos\theta_1} = \frac{\sqrt{1-x^2}}{2x} = \frac{1}{2}\sqrt{\frac{1}{x^2} - 1} \tag{35}$$

By letting $\cos\theta_2 = y$, the following equation (36) is obtained from the equation (20).

$$y = Gx \tag{36}$$

Figure 5:
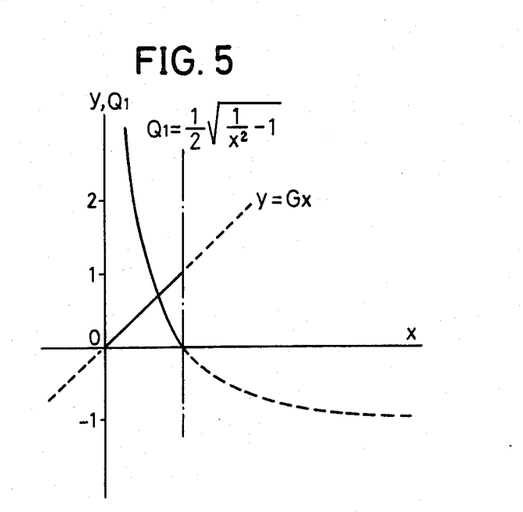
FIG. 5 is a graph showing the relationship between the quality factor Q, gain, poles, and zeros.

The relationships between them become as shown in FIG. 5. However, since $0 < \theta_1$, and $\theta_2 < \pi/2$, the relations $0 < x, y < 1$, and $Q_1 > 0$ are obtained.

Figure 6A:
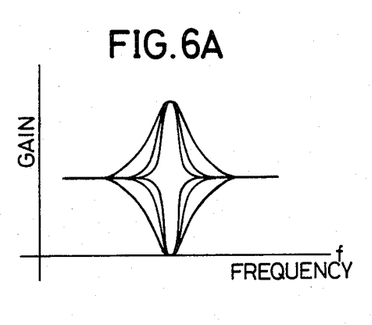
FIGS. 6A and 6B are graphs respectively showing an example of a variable digital filter characteristic having the quality factor A as its parameter, and the filter characteristic for description upon construction of that variable digital filter.
Figure 6B:
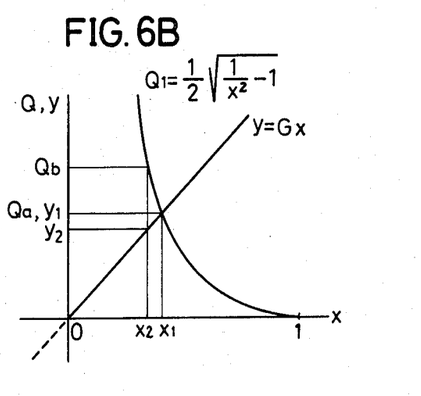

First, as shown in FIG. 6A, in the case where the variable filter characteristic is to be obtained with the quality factor Q as the parameter, and the gain held constant, $x_1$ is determined from the formula $Q_a = \frac{1}{2}\sqrt{1/x^2 - 1}$, when the $Q_a$ of the resonance circuit is determined. Accordingly, as shown in FIG. 6B, from the intersection point with the straight line $y = Gx$, $y_1$ is determined. Next, from the relationship $Q_b = kQ_a$ (where k is a constant), when $Q_b$ is determined, $x_2$ is similarly obtained. From this $x_2$, that is, the intersection of the functions $y = x_2$ and $y = Gx$, $y_2$ is determined. Thus, a variable frequency characteristic having the quality factor Q as the parameter as indicated in FIG. 6A, can simply be obtained.

Figure 7A:
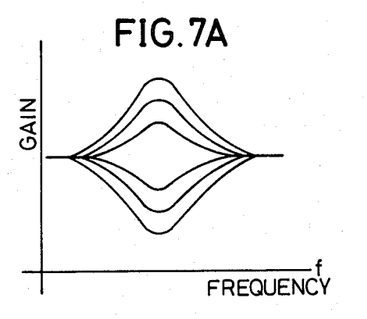
FIGS. 7A and 7B are graphs respectively showing an example of a variable digital filter characteristic having the gain (level) as its parameter, and the filter characteristic for description upon construction of the variable digital filter.
Figure 7B:
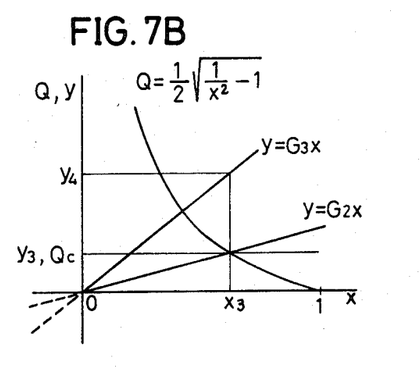

Next, the case in which a filter characteristic having constant center frequency and quality factor Q, with the gain (level) as the parameter is obtained, as indicated in FIG. 7A, will be described. In this case, the quality factor Q is fixed at $Q_c$, for example. $y_3$ is obtained from the intersection point between the value $x_3$ at this time, that is, $y=x_3$ and $y=G_2x$ in which the gain is $G_2$. Furthermore, when the gain is to be changed to a value $G_3$, $y_4$ is obtained from the intersection point between $y=x_3$ and $y=G_3 x$, and as a result, the gain can be varied to a value $G_3$. Here, of course, $G_3=hG_2$ (where h is a constant). By varying from $(x_3, y_3)$ to $(x_3, y_4)$ in this manner, the gain is readily varied from $G_2$ to $G_3$.

Figure 8A:
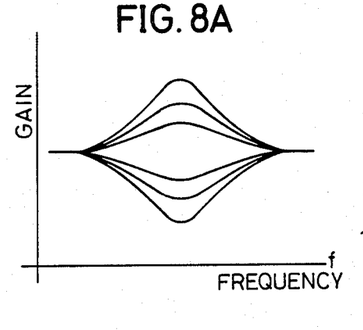
FIGS. 8A and 8B are graphs respectively showing an example of a variable digital filter characteristic having the quality factor Q and the gain (level) as its parameters, and the filter characteristic for description upon construction of that variable digital filter.
Figure 8B:
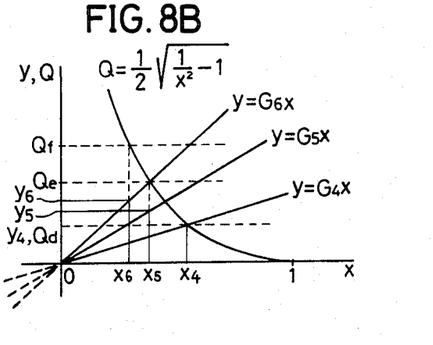

Next, the case in which a characteristic is obtained having both the quality factor Q and the gain as parameters, with the center frequency held constant, as shown in FIG. 8A, will be described in conjunction with FIG. 8B. The quality factor Q and the gain G which are to be varied respectively have the following relationships:

$$Q_l = \alpha Q_0 \atop G_m = \alpha G_0 \Bigg\} \quad (37)$$

However, in the equation (33), $\alpha$ is a constant; l is d; and e, and f and m are respectively, 4, 5, and 6.

First, from $\alpha=1$, $l=d$, and $m=4$, values for $Q_d$ and $G_4$ respectively equal to $Q_0$ and $G_0$ are determined. From this, as shown in FIG. 10B, $x_4$ is immediately determined from the position of $Q_d$ on the curve $Q=\frac{1}{2}\sqrt{1/x^2-1}$, and, from $y=G_4x$, $y_4$ at $x_4$ on this straight line is also immediately determined. Furthermore, when the values are changed to $\alpha=2$, $l=\theta$, and $m=5$, $Q_e$ and $G_5$ are similarly determined as described above, and so the values for $x_5$ and $y_5$ are determined. When the values are changed to $\alpha=3$, $l=f$, and $m=6$, $G_f$ and $G_6$ are determined as indicated in FIG. 8B, and the values for $x_6$ and $y_6$ are determined.

By the above described technique, a variable band-pass filter characteristics having the quality factor Q and the gain as its parameters, can be simply specified.

The above described filter characteristics shown in FIGS. 6A, 7A, and 8A are band-pass filter characteristics, but in the case where band-elimination filter characteristics are to be varied, it can be obtained by using the roots of the numerators in the equation (32) given hereinbefore, that is, $S_2$ and $\bar{S}_2$ in the equations (33) and (34) as the bases.

In the above described manner, the center angular frequency $\omega_c$ is specified by the radius of a circle having on it a pole and a root in the s-plane. Furthermore, from the relation $\omega_i/2\sigma_i$ (where $i=1$ or 2), the quality factor Q is simply specified, and, by the relation $\sigma_2/\sigma_i$, the gain G is determined, and, at the same time, Q and G are varied. In addition, the difference equation of the digital filter given by the equation (32) in which the center angular frequency $\omega_c$ is varied upon necessity, becomes as indicated by the following equation (38). The variation of the center angular frequency $\omega_c$ can be carried out by varying the radius of the circle in the s-plane shown in FIG. 2.

$$y_n = a_0x_n + a_1x_{n-1} + a_2x_{n-2} - b_1y_{n-1} - b_2y_{n-2} \quad (38)$$

In the equation (38): $y_n$ represents the output signal series of the digital filter at the time instant nT (where n is an integer), $x_n$ represents the input signal series of the digital filter at the time instant nT, T is the sampling period of the input digital signal, and $a_0$, $a_1$, $a_2$, $b_1$, and $b_2$ are respectively constants.

On the other hand, when the transfer function H(z) obtained by matched z-transform is transformed using the equation (15), the following equation (39) is obtained.

$$H(z) = \frac{Y(z)}{X(z)} = a_0 \frac{1 - (z_2 + \bar{z}_2)z^{-1} + z_2\bar{z}_2z^{-2}}{1 - (z_1 + \bar{z}_1)z^{-1} + z_1\bar{z}_1z^{-2}} \quad (39)$$

In this equation, $a_0$ is a normalized coefficient. If we let $Y(z)=Y_n$ and $Y(z)z^{-1}=Y_{n-1}$, equation (39) becomes as follows.

$$y_n - (z_1 + \bar{z}_1)y_{n-1} + z_1\bar{z}_1y_{n-2} = \quad (40)$$
$$a_0x_n - (z_2 + \bar{z}_2)x_{n-1} + z_2\bar{z}_2x_{n-2}$$

Here, if $\cos\theta_2=p$ and $\cos\theta_1=q$ in the equations (9) and (10), the following relationships can be obtained from the equations (38) and (40).

$$\left. \begin{aligned} a_1 &= -(z_2 + \bar{z}_2) = -e^{-\omega_c Tp} \times 2\cos(\omega_c T\sqrt{1-p^2}) \\ a_2 &= z_2\bar{z}_2 = e^{-2\omega_c Tp} \\ b_1 &= -e^{-\omega_c Tq} \times 2\cos(\omega_c T\sqrt{1-q^2}) \\ b_2 &= z_1\bar{z}_1 = e^{-2\omega_c Tq} \\ a_0 &= \left| \frac{1 + a_1 + a_2}{1 + b_1 + b_2} \right| \end{aligned} \right\} \quad (41)$$

Figure 9:
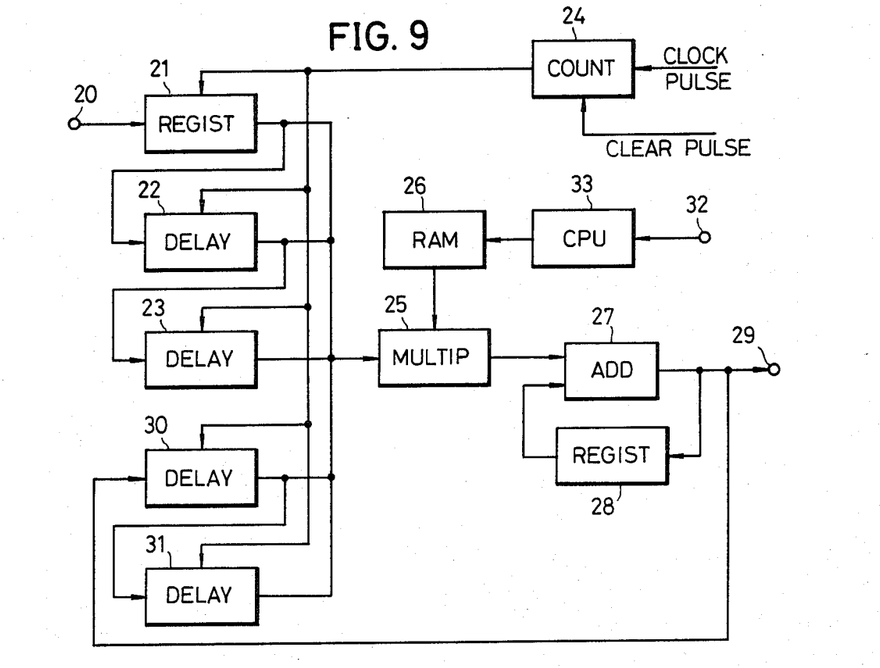
FIG. 9 is a systematic block diagram showing one embodiment of a variable digital equalizer of the present invention

A digital filter having the coefficients of the equation (41) and having the band-pass filter characteristic or the band-elimination filter characteristic of the difference equation indicated by the equation (40), has an organization of a recursive digital filter as indicated by the systematic block diagram of FIG. 9.

In the digital filter shown in FIG. 9, an analog signal comprising specific information is, for example, formed into a sampling value series of every predetermined sampling period T, and after undergoing quantization into a finite number of stages, the pulse undergoes pulse code modulation (PCM) of delta modulation, and hence a digital signal (having $x_n$ at time nT) which is the modulated pulse is supplied from an input terminal 20 and held by a register 21. The digital signal from this register 21 is successively applied to delay devices 22 and 23 in cascade connection, and delayed respectively by a time equal to the above sampling period T.

On the other hand, the output digital signals the register 21 and the delay devices 22 and 23 are successively applied in a time-divisional manner to a multiplier 25 under the control of the output of a counter 24, and successively multiplied with the coefficients $a_0$, $a_1$, and $a_2$ stored as digital quantities in a random access memory (RAM) 26, and are thereafter added to a signal from a register 28 by an adder 27. The resulting output signal is led out through an output terminal 29, and held in the register 28.

The above mentioned output digital signal ($y_n$ at the time nT) is successively applied to delay devices 30 and 31 and thereby delayed by a time equal to the aforementioned sampling period T and, after output selection of the above mentioned delay device 23, the signal is successively led out time-divisionally as output from the delay device 30 and then from the delay device 31.

Then, similarly as described hereinabove, the output signal is obtained from the output terminal 29 through the multiplier 25 and the adder 27. As a result, a digital signal $y_n$ expressed by the equation (38) at time nT is produced as output through the output terminal 29, and undergoes digital-to-analog conversion by a D/A converter (not shown) provided in the following stage, thereby being led out as an analog signal to which a specific frequency characteristic has been imparted.

The READ addresses of the RAM 26 change due to the change in the quality factor Q and the gain G to desired values, and coefficients of predetermined values are read from the RAM 26 by the output signal of a central processing unit (CPU) 33 which is controlled by the control signal from an input terminal 32.

A numerical example of the above embodiment of a digital filter will now be described. Upon designing of a band-pass filter having the quality factor Q as its parameter, in which the sampling frequency is 50 kHz, the center frequency is 2 kHz, and the gain G is 2 (or 6 dB), $\theta_1$ is determined by the equation (11), and a $\theta_2$ satisfying the equation (23) is determined, and hence the coefficients $a_0$, $a_1$, $a_2$, $b_1$, and $b_2$ become of the values shown in TABLE 1 for the quality factor Q values of 1.5, 3, and 12.

TABLE 1

| | Q | | |
|---|---|---|---|
| | 1.5 | 3 | 12 |
| $a_0$ | 1.079304 | 1.041284 | 1.010459 |
| $a_1$ | −1.673845 | −1.789747 | −1.897475 |
| $a_2$ | 0.7276708 | 0.8476632 | 0.959012 |
| $b_1$ | −1.794942 | −1.860379 | −1.917111 |
| $b_2$ | 0.853036 | 0.9206861 | 0.9792917 |

Figure 10A:
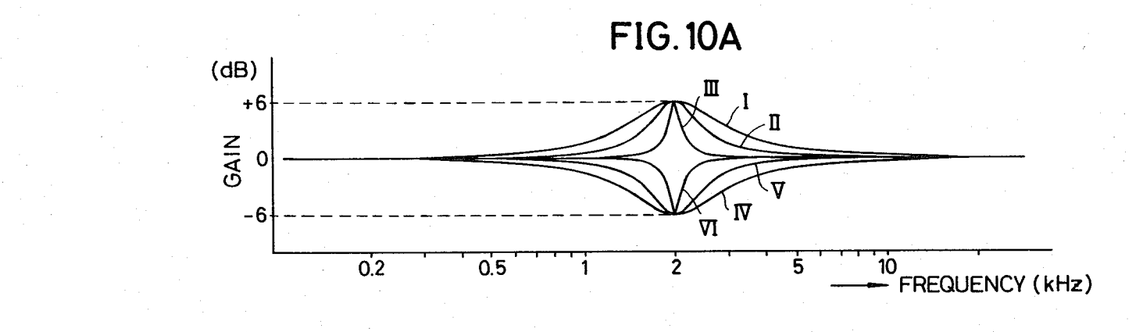
FIGS. 10A and 10B are graphs respectively showing the frequency characteristic and phase characteristic of the embodiment of a variable digital filter of the present invention having the quality factor Q as its parameter.
Figure 10B:
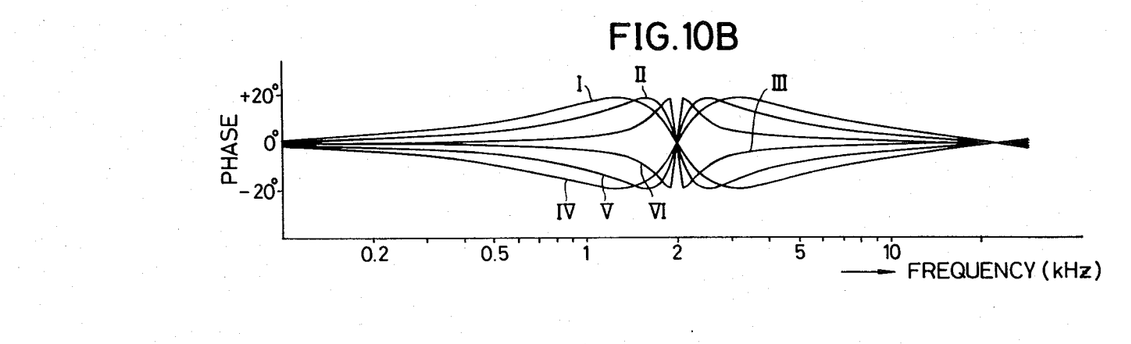

The frequency characteristic for when the quality factor Q is 1.5 is shown by the curve I, and when the quality factor Q is 3 and 12, they are respectively shown by the curves II and III, of FIG. 10A. The phase characteristics for when the quality factor Q is 1.5, 3, and 12, are respectively shown by each of the curves I, II, and III of FIG. 10B.

Upon obtaining the hand-elimination filter characteristics for the quality factor Q of 1.5, 3, and 12 under the same conditions as described above, the coefficients become of the values shown in TABLE 2.

TABLE 2

| | Q | | |
|---|---|---|---|
| | 1.5 | 3 | 12 |
| $a_0$ | 0.9265229 | 0.9603531 | 0.9896493 |
| $a_1$ | −1.794942 | −1.8603790 | −1.9171110 |
| $a_2$ | 0.853036 | 0.9206861 | 0.9792917 |
| $b_1$ | −1.673845 | −1.7897470 | −1.8974750 |
| $b_2$ | 0.7276708 | 0.8476632 | 0.9590120 |

The frequency characteristics under this condition are shown in FIG. 10A for the cases when the quality factor Q is 1.5, 3, and 12, and for each of the cases, they are respectively shown by the curves IV, V, and VI. The phase characteristics are similarly shown by the curves IV, V, and VI in FIG. 10B.

In the case where the sampling frequency, and the center frequency are respectively all constant at 50 kHz and 2 kHz, and the quality factor is constant at 3, and the gain G is varied to 2 (6 dB), 3 (10 dB), and 4 (12 dB), the coefficients $a_0$, $a_1$, $a_2$, $b_1$, and $b_2$ for the band-pass filter characteristic is shown in TABLE 3, and in TABLE 4 for the band-elimination filter characteristic.

TABLE 3

| | G | | |
|---|---|---|---|
| | 2 | 3 | 4 |
| $a_0$ | 1.041284 | 1.083654 | 1.127136 |
| $a_1$ | −1.789747 | −1.724779 | −1.665027 |
| $a_2$ | 0.8476632 | 0.7804306 | 0.7185312 |
| $b_1$ | −1.860379 | −1.860379 | −1.860379 |
| $b_2$ | 0.9206861 | 0.9206861 | 0.9206861 |

TABLE 4

| | G | | |
|---|---|---|---|
| | 2 | 3 | 4 |
| $a_0$ | 0.9603531 | 0.9228035 | 0.9206861 |
| $a_1$ | −1.860379 | −1.860379 | −1.860379 |
| $a_2$ | 0.9206861 | 0.9206861 | 0.887204 |
| $b_1$ | −1.789747 | −1.724779 | 0.7185312 |
| $b_2$ | 0.8476632 | 0.7804306 | −1.665027 |

Figure 11A:
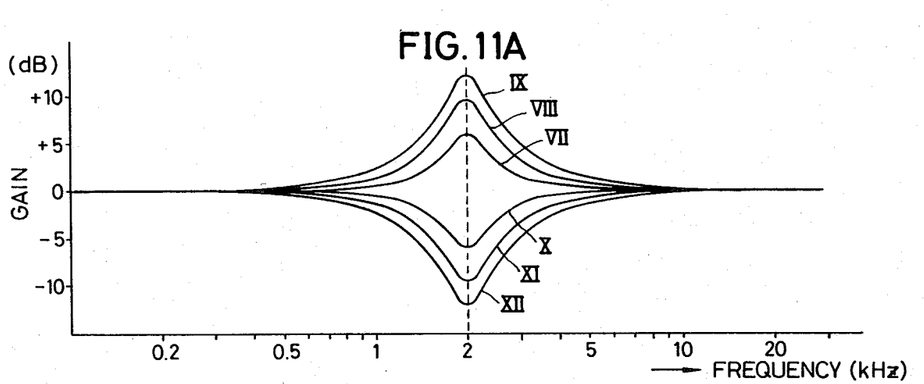
FIGS. 11A and 11B are graphs respectively showing the frequency characteristic and phase characteristic of another embodiment of a variable digital filter of the present invention having the gain as its parameter.
Figure 11B:
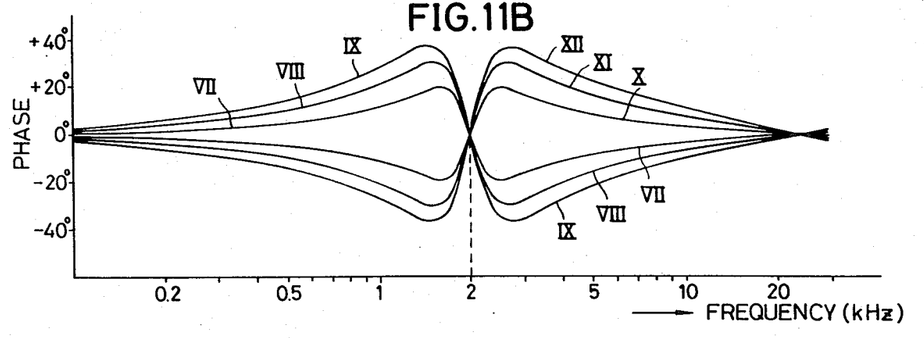

The frequency characteristics of the band-pass filter for when the gain G is 2, 3, and 4 are shown by the curves VII, VIII, and IX in FIG. 11A, and the phase characteristics are similarly shown by the curves VII, VIII, and IX in FIG. 11B. On the other hand, the frequency characteristics of the band-elimination filter are shown by the curves X, XI, and XII in FIG. 11A, and the phase characteristics are similarly shown by the curves X, XI, and XII in FIG. 11B.

Figure 12A:
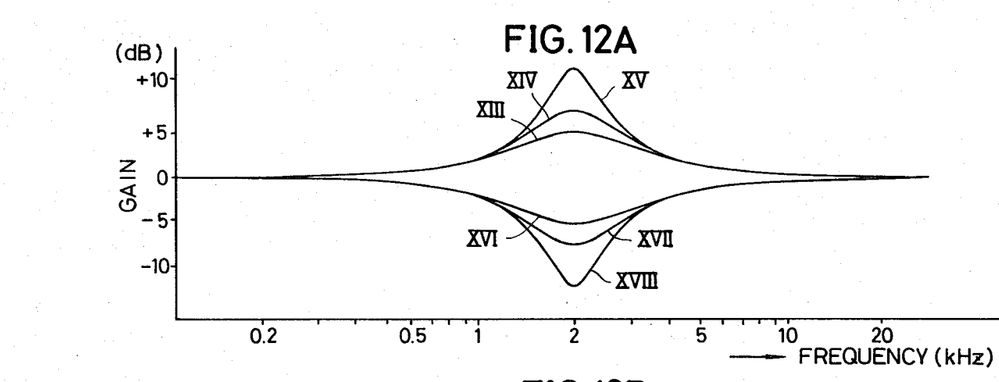
FIGS. 12A and 12B are graphs respectively showing the frequency characteristic and phase characteristic of still another embodiment of a variable digital filter of the present invention having both the quality factor Q and the gain as its parameters.
Figure 12B:
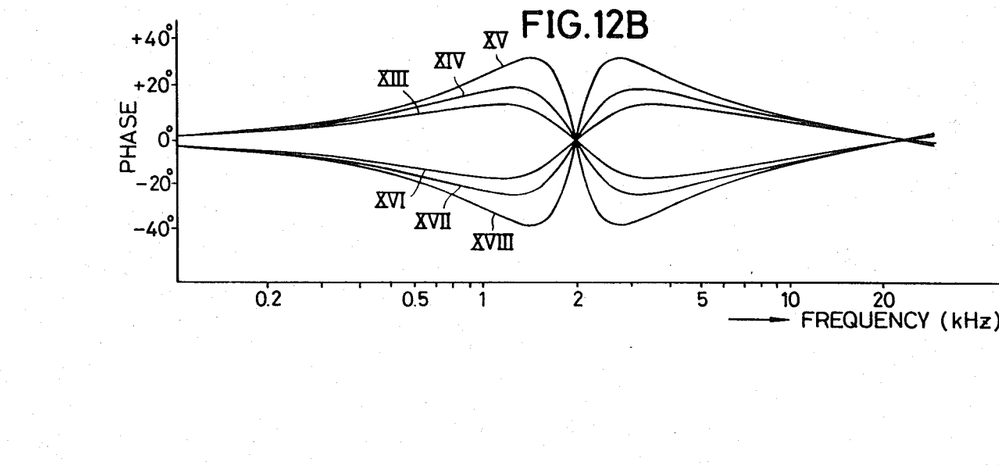

Furthermore, an example in which the sampling frequency and the center frequency are respectively constant at 50 kHz and 2 kHz, and the quality factor Q and the gain G are both varied at the same time, the frequency characteristics become of the form shown in FIG. 12A, and the phase characteristics become of th form shown in FIG. 12B. In these FIGS. 13A and 13B, the curves XIII, XIV, and XV show the characteristics for when the variable digital filter is a band-pass filter, and the curves XVI, XVII, and XVIII show the characteristics for when the variable digital filter is a band-elimination filter. The method of obtaining the coefficients is the same as the above case, and the numerical example will be omitted.

In all the above embodiments, the quality factor Q was obtained from the approximating equation (34) and not the equation (33), but the quality factor Q can be obtained accurately by solving the equation (33) as a function of $Q_i$ and $\omega_i$ as shown in a equation (42) below.

$$\left. \begin{array}{l} \sigma_i = \dfrac{\omega_i}{2Q_i} \quad (i = 1, 2) \\[2ex] \omega_i = \sqrt{\left(\dfrac{\omega_i}{2Q_i}\right)^2 - \omega_i^2} \end{array} \right\} \quad (42)$$

The equation (42) above can be solved algebraicly as a function of $Q_i$ and $\omega_i$.

The above designing technique can be used when constructing a variable digital filter comprising a plurality of poles and zeros, which has a plurality of the above variable digital filters connected in series, and by arranging the above variable digital filters in parallel connection, a variable digital filter having a band-pass filter characteristic or a band-elimination filter characteristic can be constructed by a simple designing technique, in which the peaks and dips can be varied under several different frequencies. In this case, by the division of the input digital signal into a plurality of frequency domains, the level can be increased or decreased separately to a predetermined value in each of the division of the frequency domain.

Furthermore, the above variable digital filter can be used as a graphic equalizer for sound quality correction, and also as a voice mixing device by supplying a Formant frequency and varying the quality factor Q. When the input digital signal is an audio signal, by giving a transfer function substantially equal to that of a room, which is the sound source, to a digital filter, it can be used as a reverberation adding device which adds the reverberations of a predetermined room to the input digital signal.

Further, this invention is not limited to these embodiments but various variations and modifications may be made without departing from the scope of the invention.

What is claimed is:

1. A digital equalizer capable of arbitrarily varying at least one of a center frequency, a quality factor (Q), and a gain of the equalizer to perform various frequency characteristics, said digital equalizer comprising: first delay means for delaying an input digital signal by a sampling period (T);

second delay means for delaying the output signal of said first delay means by the sampling period (T);

first multiplier means for multiplying the input digital signal by a first coefficient ($a_0$);

second multiplier means for multiplying the output signal of said first delay means by a second coefficient ($a_1$);

third multiplier means for multiplying the output signal of said second delay means by a third coefficient ($a_2$);

adding means for adding the output signals of the first, second, and third multiplier means and first and second feedback signals;

third delay means for delaying the output signal of said adding means by the sampling period (T);

fourth delay means for delaying the output signal of said third delay means by the sampling period (T);

fourth multiplier means for multiplying the output signal of said third delay means by a fourth coefficient ($b_1$) to produce said first feedback signal;

fifth multiplier means for multiplying the output signal of said fourth delay means by a fifth coefficient ($b_2$) to produce said second feedback signal;

the output signal of said adding means being derived as the output signal of said digital equalizer;

said digital equalizer having a transfer function H (z) which is a z-transform of a transfer function H (s) in Laplace transform expressed by $$H(s) = k \frac{s^2 + \frac{\omega_{02}}{Q_2} s + \omega_{02}^2}{s^2 + \frac{\omega_{01}}{Q_1} s + \omega_{01}^2}$$

wherein k is a normalizing coefficient, $\omega_o 1$ and $\omega_o 2$ are angular frequencies of the pole and zero respectively, $Q_1$ is a quality factor primarily selected for the equalizer to perform a band-pass characteristic, and $Q_2$ is a quality factor primarily selected for the equalizer to perform a band-elimination characteristic, said transfer function H (s) having conjugate pairs of poles and zeros which lie on positions on the same circle of a radius $\omega_c$ in the s-plane, wherein $\omega_o 1$ and $\omega_o 2$ are angular frequencies of the pole and zero respectively, $\omega_c$ is a center angular frequency of the band-pass characteristic and the band-elimination characteristic performed respectively by said digital equalizer, an angle ($\theta_1$) between a line passing one of the positions of the conjugate pair of poles from the origin of the s-plane and the negative real axis and an angle ($\theta_2$) between a line passing one of the positions of the conjugate pair of zeros from the origin of the s-plane and the negative real axis being so selected that $\cos \theta_2 / \cos \theta_1$ is equal to the gain Q1/Q2 at the center frequency of the band-pass characteristic and band-elimination characteristic of said digital equalizer respectively, said second coefficient, ($a_1$) being equal to $$-e^{-\omega_c Tp} \times 2 \cos (\omega_c T \sqrt{1 - p^2})$$

wherein p equals $\cos \theta_2$, said third coefficient ($a_2$) being equal to $e^{-2\omega_c Tp}$, said fourth coefficient ($b_1$) being equal to $$-e^{-\omega_c Tq} \times 2 \cos (\omega_c T \sqrt{1 - q^2})$$

wherein q equals $\cos \theta_1$, said fifth coefficient ($b_2$) being equal to $e^{-2\omega_c Tq}$, and said first coefficient ($a_0$) being equal to $$\left| \frac{1 + a_1 + a_2}{1 + b_1 + b_2} \right|.$$

* * * * *